Sept. 10, 1957 N. H. ENENSTEIN 2,806,140

MULTIPLE RESPONSE-WAVE GUIDE DISCRIMINATOR

Original Filed Dec. 19, 1952

INVENTORS.
NORMAN H. ENENSTEIN,
BY
Henry Heyman
ATTORNEY.

United States Patent Office 2,806,140 Patented Sept. 10, 1957

2,806,140

MULTIPLE RESPONSE-WAVE GUIDE DISCRIMINATOR

Norman Harry Enenstein, Los Angeles, Calif., assignor to Hughes Aircraft Company, Culver City, Calif., a corporation of Delaware Original application December 19, 1952, Serial No. 327,018. Divided and this application June 2, 1954, Serial No. 433,963

4 Claims. (Cl. 250—27)

Figure 1:
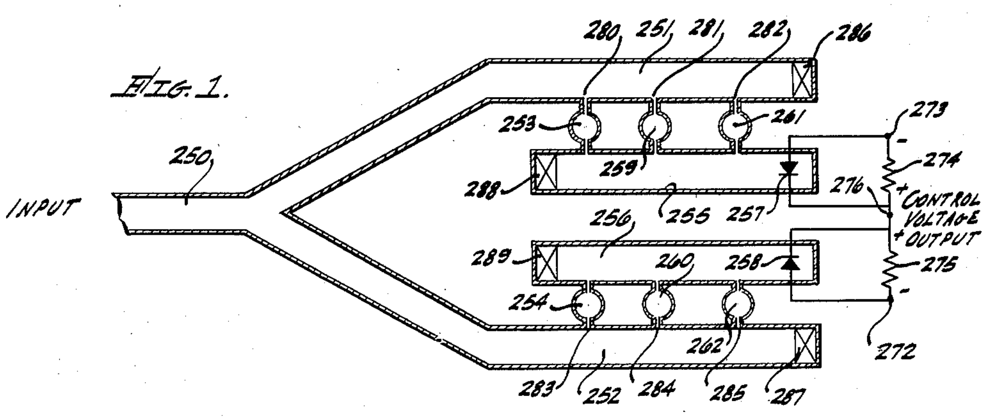

This invention relates to frequency discriminators and in particular to a multiple response discriminator waveguide structure.

This application is a division of joint application Serial No. 327,018, filed December 19, 1952, by the present inventor and N. A. Begovich for "Radar Scanning System."

In certain applications of radio frequency equipment operating in the microwave regions it is necessary to operate an oscillator at several discrete frequencies. An oscillator in such an application is cyclically operated at several frequencies in time sequence.

In one system producing a plurality of frequencies, the radio-frequency is generated by a wide band high frequency oscillator in a series of frequency steps and applied to an antenna array. In an embodiment of this system, which is disclosed in the aforementioned copending application for patent Serial No. 327,018, the frequency of the wide band oscillator is changed upon the application of a control voltage having a "staircase" wave shape. Each "step" of the voltage wave controls the wide-band oscillator so as to generate output energy of a different selected frequency. Coupled to the oscillator is a multiple response discriminator such as contemplated by this invention incorporating a system of waveguides selectively responsive to as many frequencies as are generated by the wide band oscillator in response to the individual steps of the voltage wave. The discriminator provides an automatic frequency control voltage which is fed back to the staircase voltage generating means to maintain the wide band high frequency oscillator at the predetermined frequency corresponding to a particular step for the duration of each step of the staircase voltage wave.

Accordingly is is an object of this invention to provide a multiple response wave guide structure for frequency discrimination at a plurality of frequencies.

Another object of this invention is to provide a microwave discriminator structure having a plurality of response frequencies each of which is sequentially related to the other.

It is a further object of this invention to provide a multiple response discriminator producing a single D. C. output voltage that is zero at the center frequency of any one of its multiple response frequencies and producing a negative or positive value as the frequency deviates within certain limits below and above each center frequency.

It is still another object of this invention to provide a multiple response discriminator for use in an automatic frequency control circuit to control a single oscillator at a plurality of sequentially related frequencies.

Figures 2A, 2B:
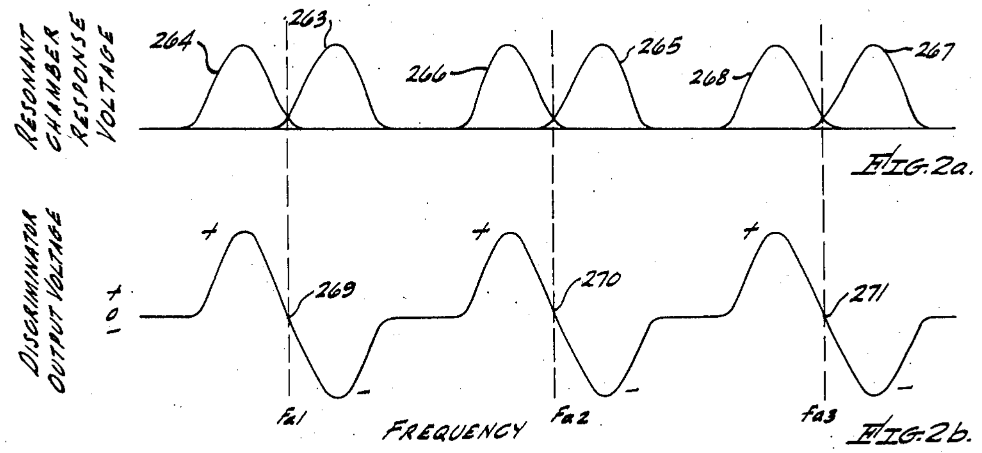
Figure 3:
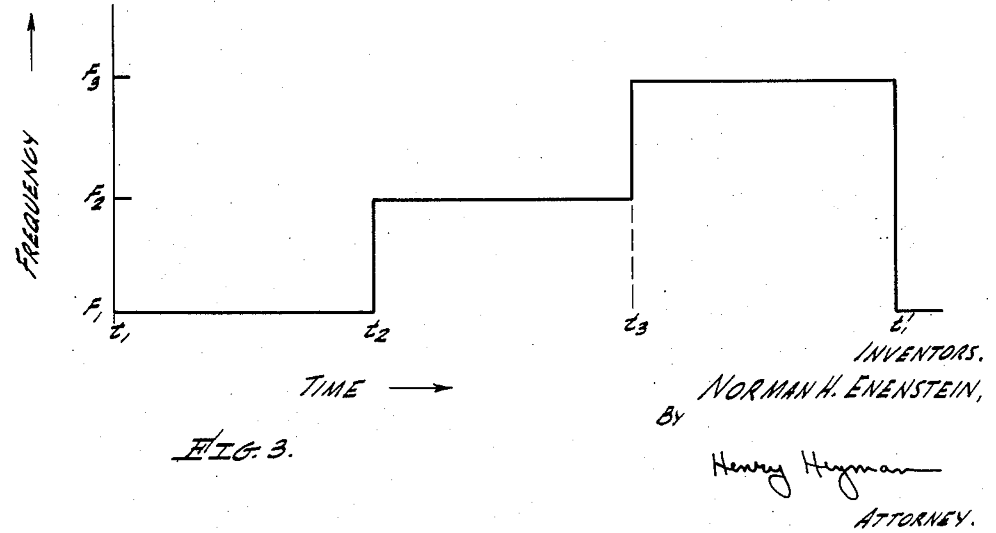

The novel features of the invention will become clear from the foregoing discussion, the detailed description of the figures which follows, and the appended claims. The organization of the invention and its operation, along with further objects and advantages of its use, will be understood by referring to the following description in connection with the accompanying drawings, in which:

Figure 1 is a schematic illustration of the multiple response discriminator of this invention and an associated circuit;

Figures 2*a* and 2*b* are graphs of the output voltage with respect to frequency of the discriminator shown in Figure 1; and Figure 3 is a graphic representation of the step relationship of three frequencies applied to the discriminator of this invention.

Oscillatory energy at frequency $f_a$ is applied from an external source, not shown, to the input 250 of the multiple response discriminator of this invention. The multiple response discriminator, hereinafter designated simply as discriminator, develops a correction voltage at its output terminals 272—273 in response to any deviation of the oscillatory wave from a center frequency $f_a$ within predetermined limits. An application of the discriminator is in an automatic frequency control where a correction voltage developed by the discriminator is applied through an AFC feedback network to a "staircase" control voltage generator, not shown in the figures but which is described fully in the aforementioned copending application Serial No. 327,018. The "staircase" control correction voltage is applied to a frequency control circuit to maintain the frequency of the energy generated by an R. F. oscillator in the external source at the proper center frequency $f_a$ during any step of the staircase control voltage generated. Each voltage level is corrected above and below its nominal voltage to shift the oscillator frequency higher or lower as necessary to maintain the correct frequency. The details of construction of the discriminator of the present invention are illustrated in Fig. 1 and waveforms of its operation are shown in Figs. 2*a* and 2*b*, which are described in detail hereinafter.

The multiple response discriminator shown in Fig. 1, produces a direct-current voltage having a polarity representative of the direction of the frequency deviation of the wave developed by an external oscillator with respect to any one of a plurality of predetermined center frequencies corresponding to frequency $f_{a1}$, $f_{a2}$, $f_{a3}$, and so forth, as represented by the graphs of Fig. 2*b*. The discriminator of this invention may be considered an assembly of waveguide comb filters. A section of waveguide 250 is bifurcated to provide waveguide forks 251 and 253. In the wall of fork 251, there is provided an opening 280 which couples the fork to output waveguide 255 through a resonant chamber 253, resonant at a predetermined frequency higher than $f_{a1}$. There is also disposed in the wall of fork 251 an opening 281 which couples a resonant chamber 259 to output waveguide 255. Resonant chamber 259 is resonant at a predetermined frequency higher than frequency $f_{a2}$. Further disposed in fork 251 is a third opening 282 coupling the waveguide fork 251 to output waveguide 255 through a resonant chamber 261. Resonant chamber 261 is resonant at a predetermined frequency higher than frequency $f_{a3}$.

Correspondingly, in the wall of fork 252, there are disposed openings 283, 284, 285 coupling the waveguide fork 252 to an output waveguide 256 through resonant chambers 254, 260, and 262, respectively. Resonant chambers 254, 260, and 262 are resonant respectively to a predetermined frequency lower than $f_{a1}$, lower than frequency $f_{a2}$, and lower than $f_{a3}$. Fork 251 is terminated in an impedance 286, while fork 252 is terminated in an impedance 287. Output waveguide 255 is provided with a terminating impedance 288 in one end and, in the opposite end, with a rectifier 257. Output waveguide 256 has a terminating impedance 289 disposed in one end and a rectifier 258 in its opposite end.

The rectifiers 257 and 258 are connected in a common output circuit comprising resistors 274 and 275 connected in series, the common junction 276 of the two resistors 274, 275, being connected to the cathode terminals of rectifiers 257, 258. The other end of resistor 274 is connected to the anode terminal of the rectifier 257 forming output terminal 273, and the other end of resistor 275 is connected to the anode end of rectifier 258 comprising output terminal 272.

Waveforms of the responses of the several branches of the multiple response discriminator of Fig. 1 are shown in Fig. 2*a*. Waveforms of the overall voltage output response of the multiple response discriminator are shown in Fig. 2*b*.

The curve of Fig. 2*b* illustrates the output voltage response between terminals 273 and 272 as a function of frequency deviations above and below the frequencies $f_{a1}$, $f_{a2}$, and $f_{a3}$, respectively. The output voltage between terminals 272, 273 is zero when the exact frequencies $f_{a1}$, $f_{a2}$, $f_{a3}$ are applied to waveguide 250 from the external source of R. F. oscillations as shown in the curves of Fig. 2*b* at 269, 270, 271, respectively.

The operation of the discriminator of this invention may be clearly followed with reference to the waveforms of Fig. 2*a* showing the responses of the several chambers in terms of the voltage transmitted into the output waveguides 255 and 256 with respect to frequency. Fig. 2*b* shows the overall D. C. output voltage waveform of the discriminator. Energy applied to the input waveguide 250 of the discrminator from an R. F. oscillator at any instant may include one of the frequency components $f_{a1}$, $f_{a2}$, or $f_{a3}$ or any frequency deviation above or below these frequencies. The center frequencies for which the resonant system of the multiple response discriminator is designed are $f_{a1}$, $f_{a2}$, $f_{a3}$. These frequencies are related in the manner shown in Fig. 4 as $F_1$, $F_2$, $F_3$ and may be generated, with respect to time, as illustrated in the step wave form of Fig. 3: $F_1$ occurring from time $t_1$ to $t_2$; $F_2$ occurring from $t_2$ to $t_3$ and $F_3$ occurring from $t_3$ to $t_1'$ (the beginning of a succeeding cycle). The energy applied to input waveguide 250 will divide equally between the two waveguide forks 251 and 252. As long as one of the frequencies $f_{a1}$, $f_{a2}$, or $f_{a3}$ is present, no output voltage appears across the output terminals 273 and 272. In response to the voltage step of the "staircase" voltage generator previously mentioned occurring during the interval $t_1$ to $t_2$, an R. F. oscillator generates the frequency $f_{a1}$. If for any reason the oscillator should drift to oscillate at a frequency lower than $f_{a1}$, the resonant chamber 254, having a response as illustrated in Fig. 2*a* at 264, will permit the transmission of energy into output waveguide 256. This energy will be rectified by rectifier 258 providing an output voltage of positive polarity across the output terminals 273, 272. The voltage amplitude will depend upon the extent of the frequency deviation within the limits of the response curve 264, (Fig. 2*a*). The positive voltage developed across terminals 272, 273 is applied to the external "staircase" control voltage generator previously mentioned through an AFC network (not shown in the present disclosure) to adjust the step voltage during the interval $t_1$ to $t_2$ so that the oscillator frequency $f_{a1}$ is maintained at its predetermined value. Should the frequency deviate to a value higher than the center frequency, then resonant chamber 253, having a response as illustrated by curve 263, in Fig. 2*a*, will permit energy to pass into output waveguide 255, which will be rectified by rectifier 257 to produce a negative voltage between terminals 273, 272 having an opposite polarity to that produced as a result of a frequency lower than $f_{a1}$. The negative output voltage at terminals 273, 272 is applied, as before, to the "staircase" voltage generator 208 to correct the voltage step of the "staircase" voltage generator 208, so as to return the oscillator frequency to the center frequency $f_{a1}$.

A similar action occurs for frequencies deviating from $f_{a2}$, wherein resonant chambers 259, 260 respond, respectively, to develop voltages illustrated by curves 266, 265 in Fig. 2*a*, thereby to provide correction voltages during the second step occurring in the interval $t_2$ through $t_3$ to maintain the center frequency $f_{a2}$ constant for the duration of this time interval. A similar action occurs for frequencies deviating from $f_{a3}$, wherein resonant chambers 261, 262 respond as illustrated by waves 268, 267, respectively, in Fig. 2*a*, to provide correction voltages during the third step occurring in the interval $t_3$ through $t_1$ to maintain the center frequency $f_{a3}$ constant for the duration of the third time interval.

The operation of the discriminator of Fig. 1 for any one frequency of its plurality of responses is essentially similar to that of the well known Conrad double-tuned discriminator. This has also been known in the radio field as a Round-Travis discriminator. The resonant circuit of the discriminator 205, represented by resonant chamber 253 tuned higher than center frequency $f_{a1}$, and by resonant chamber 254 tuned lower than the center frequency $f_{a1}$, correspond to the parallel resonant circuits of the Conrad or Round-Travis discriminator, one tuned above and the other one tuned below the center frequency. In the discriminator 205 there are three such double-tuned resonant circuits operating into discriminator rectifiers 257, 258 common to all three pairs of resonant chambers to maintain each of the three oscillator frequencies constant during each step of the operation of the external R. F. oscillator.

While the discriminator as shown in the figures and described above is responsive to the three frequencies only that are being used as illustrative examples, it will be readily apparent that any predetermined number of frequencies may be controlled through the use of a similar automatic frequency control arrangement in which there will be a multiple response discriminator such as contemplated by this invention comprising as many pairs of resonant chambers as there are frequency steps generated by the external source of high frequency oscillations.

What is claimed is:

1. In an automatic frequency control system for an oscillator which generates energy at a plurality of frequencies, a multiple frequency responsive wave guide discriminator comprising: a plurality of pairs of fixed chambers each unit of said pairs being resonant, respectively, at a single fixed frequency, one chamber of each pair of resonant chambers being resonant, respectively, at a frequency above, and the other to a frequency below one of said plurality of frequencies; a bifurcated input wave guide structure; a pair of output wave guide structures, one chamber of each of said pairs of fixed resonant chambers being coupled between one of the arms of said bifurcated input wave guide structure and the first of said pair of output wave guide structures; the other chamber of each of said pairs of fixed resonant chambers being coupled between the second arm of said input wave guide structure and the second of said pair of output wave guide structures; a pair of rectifiers, said rectifiers being positioned respectively in said output wave guide structures and adapted to rectify the energy from said resonant chambers impressed on said output wave guide structures; and comparison means coupled to said rectifiers for deriving a unidirectional voltage in response to said rectified energy, said voltage having a polarity indicative of whether the energy is above or below said one of said plurality of frequencies and an amplitude indicative of the degree thereof.

2. A discriminator responsive to a plurality of carrier waves impressed thereon, each having a fixed center frequency, the frequencies of said carrier waves being subject to variation, said discriminator comprising; an input waveguide for receiving said carrier waves; a first and a second output waveguide; a plurality of pairs of resonant coupling chambers, one of each of said pairs of said resonant coupling chambers being connected between said input waveguide and said first output waveguide and resonating at a frequency higher than the center frequency of one of said carrier waves, the other of each of said pairs of said resonant coupling chambers being connected between said input waveguide and said second output waveguide and resonating at a frequency lower than the center frequency of said one of said carrier waves; detecting means connected in respective ones of said output wave guides for receiving the carrier waves impressed on said resonant coupling chamber, and for developing unidirectional voltages in response to said waves; and an output circuit coupled to said detecting means for algebraically adding the voltages developed by said detecting means to derive an output voltage, said output voltage having an amplitude representative of the degree of the variation of each said one carrier wave about its center frequency and having a polarity representative of the direction of said frequency variation.

3. A microwave discriminator responsive to a plurality of carrier waves impressed thereon, each of said waves having a fixed center frequency, the frequencies of said carrier waves being subject to variation about said center frequency, said discriminator comprising; a bifurcated input wave guide for receiving said carrier waves; a first and a second output waveguide; a plurality of pairs of resonant chambers, one chamber of each of said pairs of said resonant chambers being coupled between one arm of said input wave guide and said first output wave guide and resonating at a frequency higher than the center frequency of one of said carrier waves, the other chamber of each of said pairs of resonant chambers being coupled between the other fork of said input wave guide and said second output wave guide and resonating at frequency lower than the center frequency of said one of said carrier waves; a pair of rectifiers, said rectifiers being connected in respective ones of said output wave guides for receiving said carrier waves impressed on said resonant chambers, and for developing unidirectional voltages in response to said waves; and an output circuit coupled to said rectifiers for algebraically adding the voltages developed by each of said rectifiers to derive an output voltage said output voltage having an amplitude representative of the degree of the variation in frequency of each said one carrier wave about its center frequency and having a polarity representative of the direction of said frequency variation.

4. A multiple response waveguide discriminator comprising: a bifurcated input waveguide structure having a first and a second inner side wall, said bifurcated waveguide structure being adapted for excitation by electromagnetic wave energy over a predetermined band of frequencies; a plurality of pairs of fixed frequency resonant chambers; a first and a second output waveguide structure, one resonant chamber of each of said pairs of resonant chambers being coupled between said first inner side wall of said bifurcated waveguide structure and said first output waveguide structure, each said one resonant chamber being responsive to a range of frequencies above a selected frequency in said predetermined band of frequencies; the other resonant chamber of each of said pairs of resonant chambers being coupled between said second inner side wall of said bifurcated waveguide structure and said second output waveguide structure; each said other resonant chamber being responsive to a range of frequencies below said selected frequency; a first and a second rectifier; said first rectifier being connected in said first output waveguide structure and responsive to said range of frequencies above said selected frequency impressed thereon to develop a direct-current voltage of one polarity in response thereto, said second rectifier being connected in said second output waveguide structure and responsive to said range of frequencies below said selected frequency impressed thereon to develop a direct-current voltage of opposite polarity in response thereto, and comparison means connected to said rectifiers for comparing the direct-current voltages developed thereby and producing an output voltage, said output voltage being the algebraic resultant of said direct-current voltages developed by said rectifiers, the polarity of said output voltage being representative of the deviation of the frequency above or below said selected frequency and the amplitude of said output voltage being representative of the degree thereof.

References Cited in the file of this patent

UNITED STATES PATENTS

| | | |
|---|---|---|
| 2,354,827 | Peterson | Aug. 1, 1944 |
| 2,413,939 | Benware | Jan. 7, 1947 |
| 2,547,159 | Guenard | Apr. 3, 1951 |

OTHER REFERENCES

Kalmus: Some Notes on Superregeneration, etc., Proc. I. R. E., October 1944.